(12) United States Patent
Chen (10) Patent No.: US 10,128,401 B2
(45) Date of Patent: Nov. 13, 2018

(54) OPTICAL SENSOR

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventor: Hung-Jui Chen, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/821,797

(22) Filed: Nov. 23, 2017

(65) Prior Publication Data

US 2018/0108802 A1 Apr. 19, 2018

Related U.S. Application Data

(63) Continuation-in-part of application No. 15/153,317, filed on May 12, 2016, now Pat. No. 9,853,196.

(30) Foreign Application Priority Data

Sep. 17, 2015 (CN) .......................... 2015 1 0595259

(51) Int. Cl.
| | |
|---|---|
| H01L 31/167 | (2006.01) |
| H01L 31/0232 | (2014.01) |
| H01L 31/09 | (2006.01) |
| G01V 8/14 | (2006.01) |
| H04N 1/00 | (2006.01) |
| H01L 31/147 | (2006.01) |

(Continued)

(52) U.S. Cl.
CPC .......... H01L 31/167 (2013.01); G01S 7/4813 (2013.01); G01S 7/4815 (2013.01); G01S 17/026 (2013.01); G01V 8/14 (2013.01); H01L 31/02327 (2013.01); H01L 31/09 (2013.01); H01L 31/147 (2013.01); H04N 1/00734 (2013.01); G01V 8/20 (2013.01); *G03G 2215/00616* (2013.01)

(58) Field of Classification Search
CPC ..... H01L 33/60; H01L 33/58; H01L 25/0753; H01L 33/504
USPC ............................................... 257/89; 438/22
See application file for complete search history.

(56) References Cited

U.S. PATENT DOCUMENTS

2008/0303757 A1* 12/2008 Ohkawa .................... F21V 5/04
345/82
2010/0177258 A1* 7/2010 Shinozaki ......... G02F 1/133603
349/58

(Continued)

*Primary Examiner* — Jami V Miller
(74) *Attorney, Agent, or Firm* — Li & Cai Intellectual Property (USA) Office (57) ABSTRACT

An optical sensor includes a substrate, light emitting units for emitting light with different wavelengths, and a photodetector. The substrate has at least one receiver for containing these light emitting units and a slot for containing the photodetector. A light guide structure of the optical sensor can be the receiver with a specific design, so that the light emitted by the light emitting units can be reflected towards a central axis of the photodetector. Thus, when at least one of the light emitting units emits light onto an object, the photodetector can receive the light reflected from the object.

20 Claims, 11 Drawing Sheets

(51) Int. Cl.
*G01S 17/02* (2006.01)
*G01S 7/481* (2006.01)
*G01V 8/20* (2006.01)

(56) References Cited

U.S. PATENT DOCUMENTS

| | | | |
|---|---|---|---|
| 2012/0081619 A1* | 4/2012 | Shimizu | G02F 1/133603 348/790 |
| 2012/0182757 A1* | 7/2012 | Liang | G02B 6/0006 362/555 |
| 2013/0148328 A1* | 6/2013 | Park | F21K 9/13 362/84 |
| 2014/0211481 A1* | 7/2014 | Liang | F21V 29/004 362/308 |
| 2016/0025297 A1* | 1/2016 | Liu | G02B 3/08 362/97.1 |
| 2016/0025322 A1* | 1/2016 | Chen | F21V 29/773 362/373 |

* cited by examiner

OPTICAL SENSOR

CROSS REFERENCE TO RELATED APPLICATION

This application is a continuation-in-part of U.S. application Ser. No. 15/153,317 filed on May 12, 2016 and entitled "LIGHT-EMITTING DISPLAY DEVICE", now pending.

BACKGROUND OF THE INVENTION

1. Field of the Invention

The present invention relates to a sensor, and in particular, to an optical sensor.

2. Description of Related Art

A conventional optical sensor used for health detection includes a carrier, at least one light emitting unit disposed on the carrier, and a photodetector disposed on the carrier for receiving light emitted from the light emitting unit. However, the carrier of the conventional optical sensor is not formed with a specific structure for guiding the light emitted from the light emitting unit, so that the performance of the conventional optical sensor still leaves much to be desired.

SUMMARY OF THE INVENTION

The present disclosure provides an optical sensor capable of effectively addressing the potential problems associated with conventional optical sensors.

The present disclosure discloses an optical sensor, which includes a substrate, a plurality of light emitting units, and a photodetector. The substrate provides at least one receiver for containing the plurality of light emitting units and a slot for containing the photodetector. The at least one receiver has an inner light reflecting portion defined an angle is greater than an angle defined by the outer light reflecting portion. The inner light reflecting portion and the outer light reflecting portion enable light emitted by the light emitting units to be reflected towards an external object. The photodetector is configured for receiving the light reflected from the external object.

In the optical sensor provided by the embodiments of the present disclosure, a light guide structure is disposed to guide light emitted by a plurality of light emitting units on a predetermined reference axis, wherein the light guide structure may be a reflecting cup recess structure.

DETAILED DESCRIPTION OF THE PREFERRED EMBODIMENTS

First Embodiment

Referring to FIG. 1 to FIG. 3E, a first embodiment of the present disclosure is shown. It should be first noted that relevant quantities and shapes shown in the figures corresponding to this embodiment are only provided to illustrate particular implementations of the present disclosure for ease of understanding, and not to limit the scope of the present disclosure.

Figure 1:
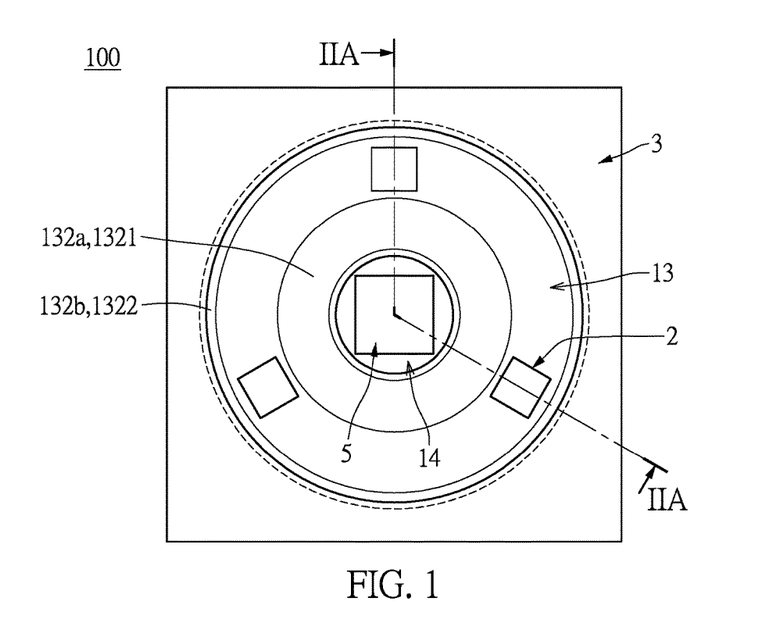
FIG. 1 is a schematic view of a first embodiment of an optical sensor according to the present disclosure.
Figure 2A:
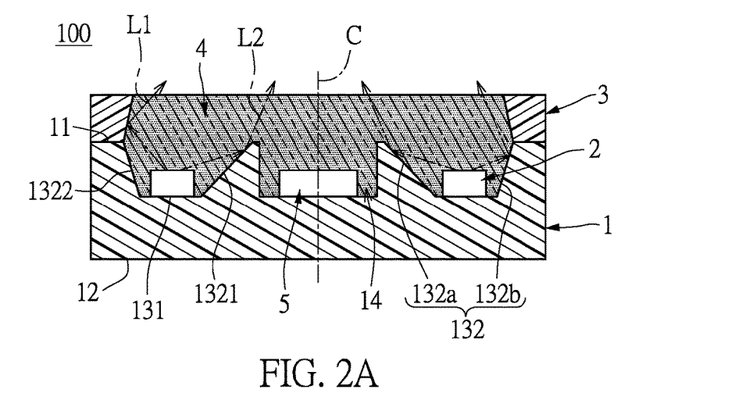
FIG. 2A is a cross-sectional view taken along line II A-II A of FIG. 1.
Figure 2B:
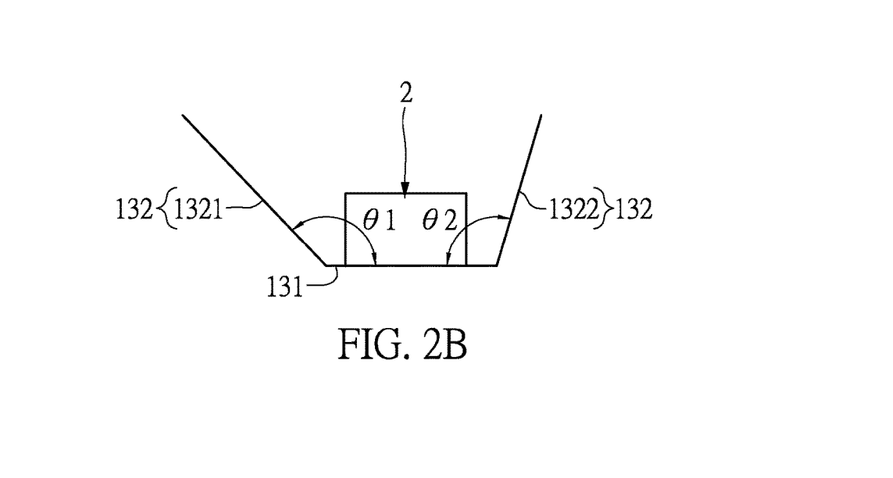
FIG. 2B is an enlarged schematic view of a part of FIG. 2A.

As shown in FIG. 1, FIG. 2A and FIG. 2B, the first embodiment discloses an optical sensor 100, which can be a health sensor, such as: a photoplethysmography (PPG) sensor, but the present disclosure is not limited thereto. The optical sensor 100 in the present embodiment includes a substrate 1, a plurality of light emitting units 2, a frame body 3, an encapsulation 4, and a photodetector 5. The light emitting units 2 and the frame body 3 are disposed on the substrate 1, and the encapsulation 4 encapsulates the light emitting units 2 and the photodetector 5. The specific construction of the optical sensor 100 provided by this embodiment is described in general as follows:

The type of the substrate 1 is not limited in this embodiment. For example, the substrate 1 in this embodiment may be a ceramic plate, a printed circuit board, a lead frame, etc. The substrate 1 has a first substrate surface 11 and a second substrate surface 12 (for example, a top surface and a bottom surface of the substrate 1 in FIG. 2A) located at opposite sides. The substrate 1 has a preset (first) reference axis C perpendicular to the first substrate surface 11, the reference axis C overlapping with a central axis defined by the photodetector 5. In other words, the reference axis C can be regarded as the central axis defined by the photodetector 5, but the present disclosure is not limited thereto. Wherein, most of the light emitted from light emitting units 2 can be concentrated on reference axis C via a light guiding structure. Moreover, the specific location of the reference axis C can vary depending on an implementation of a product. For this embodiment, the reference axis C preset to be perpendicular to the first substrate surface 11 is located approximately at a center of the first substrate surface 11.

A light guide structure of the optical sensor 100 includes a receiver 13 which is recessed from the first substrate surface 11 of the substrate and contains the plurality of light emitting units 2, wherein the receiver 13 is capable of guiding light emitted by the light emitting units 2 to the predetermined reference axis C. Further, the receiver 13 of the light guide structure in the implementation of this embodiment has an annular-shape approximately symmetrical with respect to the reference axis C, wherein a center (of a circle) of the receiver 13 is approximately located on the reference axis C. The receiver 13 has a bottom wall 131 and two side walls 132 (i.e., an outer side wall 132b and an inner side wall 132a of the receiver 13 as shown in FIG. 2A) obliquely connected to the bottom wall 131, wherein the two side walls 132 have a light reflecting function. The two side walls 132 may, for example, have a light reflecting function by being formed to have a smooth surface or being plated with a light reflecting material, but are not limited thereto.

Further, the two side walls 132 of the receiver 13 have an inner light reflecting portion 1321 proximal to the reference axis C and an outer light reflecting portion 1322 distal from the reference axis C, that is to say, the side wall 132 of the receiver 13 proximal to the reference axis C (i.e., the inner side wall 132a of the receiver 13 as shown in FIG. 2A) is defined as an inner light reflecting portion 1321, and the side wall 132 of the receiver 13 distal from the reference axis C (i.e., the outer side wall 132b of the receiver 13 as shown in FIG. 2A) is defined as an outer light reflecting portion 1322.

An angle θ1 defined by the inner light reflecting portion 1321 and the bottom wall 131 of the receiver 13 is greater than an angle θ2 defined by the outer light reflecting portion 1322 and the bottom wall 131 of the receiver 13, and the angle θ2 defined by the outer light reflecting portion 1322 and the bottom wall 131 of the receiver 13 is not less than 90 degrees. In this embodiment, the angle θ1 defined by the inner light reflecting portion 1321 and the bottom wall 131 of the receiver 13 is approximately 120 degrees to 165 degrees and the angle θ2 defined by the outer light reflecting portion 1322 and the bottom wall 131 of the receiver 13 is approximately 90 degrees to 120 degrees, but in practice, the two angles θ1 and θ2 are not limited thereto.

Figure 3A:
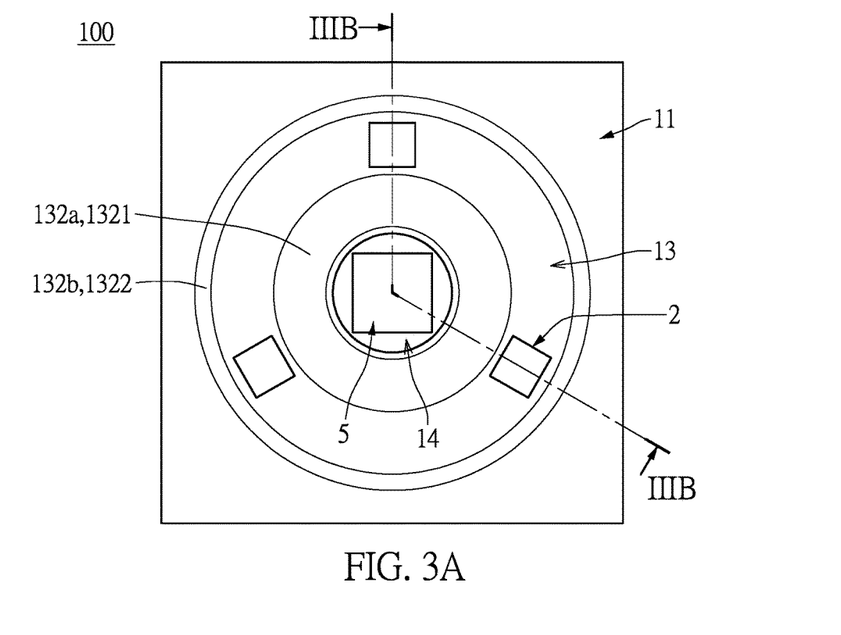
FIG. 3A is a schematic view showing the optical sensor in another structure according to the present disclosure.
Figure 3B:
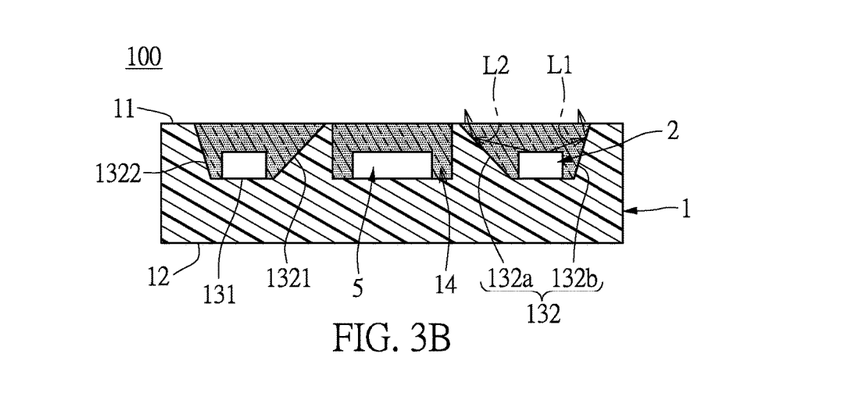
FIG. 3B is a cross-sectional view taken along line III B-III B of FIG. 3A.
Figure 3C:
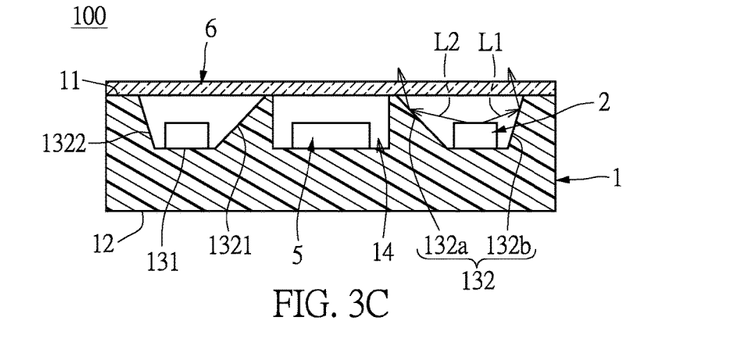
FIG. 3C is a schematic view showing the optical sensor provided with a translucent cover in which an encapsulation is omitted.
Figure 3D:
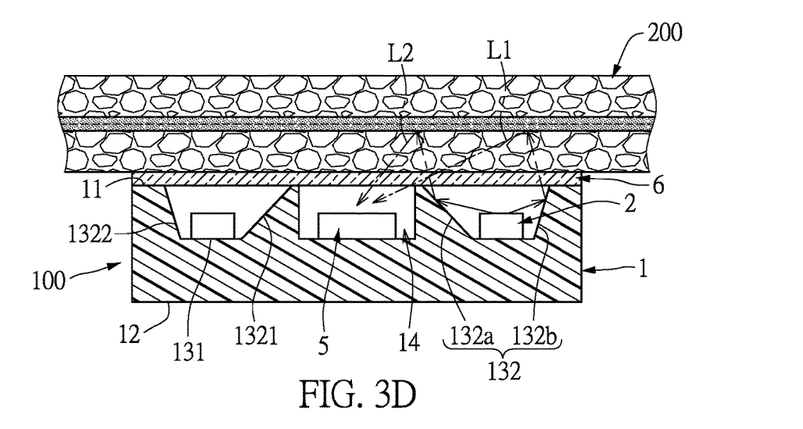
FIG. 3D is a schematic view showing the optical sensor of FIG. 3B applied to an external object.

The light emitting units 2 can be light emitting diode chips, light emitting packages, or chip scale packages (CSP) which can emit light of at least two different wavelengths. In other words, the light emitting units 2 have at least one first light emitting unit emitting a first light with a first spectrum and at least one second light emitting unit emitting a second light with a second spectrum different from the first spectrum. For example, the light emitting units 2 may include a red LED chip, a green LED chip, and an infrared LED chip, respectively, but the present disclosure is not limited thereto. In the present embodiment, light emitted from the green LED chip is within a range of 500-550 nm (preferably within 520-530 nm) and is preferably used for detecting a wrist, light emitted from the red LED chip is within a range of 640-660 nm (preferably within 655-660 nm) and is preferably used for detecting a finger, and light emitted from the infrared LED chip is close to 940 nm and is preferably used for detecting a finger. Moreover, the optical sensor 100 of the present embodiment can be used to detect the blood oxygen concentration in arterial blood by checking the absorption rate of light emitted from the red LED chip and the infrared LED chip. The light emitting units 2 are mounted on the bottom wall 131 of the receiver 13 of the substrate 1, the distances between any two of the light emitting units 2 are approximately the same, and the height of any of the light emitting units 2 is less than the depth of the receiver 13. The light emitted by the light emitting units 2 is mainly emitted upwards. The inner light reflecting portion 1321 and the outer light reflecting portion 1322 included in the light guide structure enable light L1, L2 emitted by the light emitting units 2 to be reflected through their interfaces and then emitted towards the preset reference axis C, thereby allowing the light emitted by the light emitting units 2 of the optical sensor 100 to be guided to an external object 200 as shown in FIG. 3D.

Figure 2C:
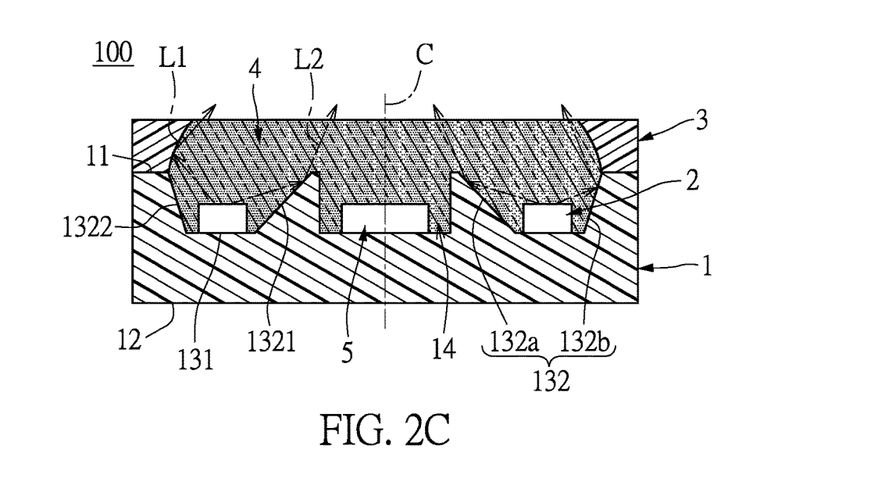
FIG. 2C is a cross-sectional view taken along line II A-II A of FIG. 1 according to another implementation of the present disclosure.

In addition to the receiver 13, the light guide structure also has the frame body 3, which is annular and has an annular inner wall surface 31, that is to say, the inner wall surface 31 surrounds and defines a through hole (not labeled). The frame body 3 is disposed on a part of the first substrate surface 11 of the substrate 1 outside the receiver 13. A bottom edge of the inner wall surface 31 of the frame body 3 is substantially connected to a top edge of the outer side wall 132b of the receiver 13. An inner diameter of the inner wall surface 31 of the frame body 3 gradually decreases in a direction away from the first substrate surface 11 (i.e., from bottom to top in FIG. 2A). A minimum inner diameter of the inner wall surface 31 is not less than a maximum outer diameter of the bottom wall 131 of the receiver 13. Provided the above conditions are met, the inner wall surface 31 may be a planar surface or a curved surface (as shown in FIG. 2C), and is not limited herein. Accordingly, the inner wall surface 31 of the frame body 3 of the light guide structure enables a light emitted by the light emitting units 2 to be reflected towards the reference axis C, that is, the light can be emitted out towards the preset reference axis C after being reflected by the interface of the frame body 3. That is to say that the frame body 3 can prevent the light from scattering, decreasing the divergence angle of the light and concentrating the light to the pre-determined direction, such as the center.

Moreover, a slot 14 is recessed from the first substrate surface 11 of the substrate 1 in the preset reference axis C. That is to say, the receiver 13 is formed around the slot 4. In other words, the inner side wall 132a of the receiver 13 proximal to the slot 14 is defined as the inner light reflecting portion 1321, and the outer side wall 132b of the receiver 13 distal from the slot 14 is defined as the outer light reflecting portion 1322. The photodetector 5 is disposed in the slot 14, and the photodetector 5 is configured for receiving the light reflected from the external object 200 (as shown in FIG. 3D). Furthermore, the light emitting units 2 and the photodetector 5 can be electrically connected to a photo sensing control chip (not shown) through the traces formed on the substrate 1. Thus, the photo sensing control chip can control the on/off states of the light emitting units 2 and receive the light signals detected by the photodetector 5, which the light signals can be processing biomedical signal such as photoplethysmography (PPG) signal or blood oxygen signal.

Specifically, if the light emitted from the light emitting units 2 is guided towards the preset reference axis C, the external object 200 can reflect the light toward the photodetector 5 more accurately. Thus, the cooperation between the light emitting units 2 and the photodetector 5 can be effectively achieved by using the light guide structure (i.e., the receiver 13 or the frame body 3) to guide the light from the light emitting units 2 toward the reference axis C.

The encapsulation 4 encapsulates the light emitting units 2 and the photodetector 5. That is to say, the encapsulation 4 is filled in a space defined by at least one of the surfaces of the side walls 132a, 132b of the receiver 13, the slot 14, and the inner wall surface 31 of the frame body 3.

From the above description, in the optical sensor 100 provided in the present embodiment, the light guide structure (for example, the inner light reflecting portion 1321, the outer light reflecting portion 1322, and the inner wall surface 31 of the frame body 3) is disposed to enable the light emitted by the light emitting units 2 to be emitted out towards the preset reference axis C after being respectively reflected by the surface of the light guide structure.

Moreover, the optical sensor 100 provided in this embodiment may also be adjusted according to designer requirements and is not limited to the implementation shown in FIG. 2A. For example, as shown in FIG. 3A to FIG. 3D, in the case that the light reflecting effects of the inner light reflecting portion 1321 and the outer light reflecting portion 1322 are sufficient to meet the requirements, the frame body 3 may also be omitted from the optical sensor 100. Moreover, the optical sensor 100 can be provided without the encapsulation 4, and the optical sensor 100 can further include a translucent cover 6 disposed on the substrate 1 for protecting the light emitting units 2 and the photodetector 5. In addition, the substrate 1 (or the frame body 3) is preferably formed with a black top surface or a white top surface.

Figure 3E:
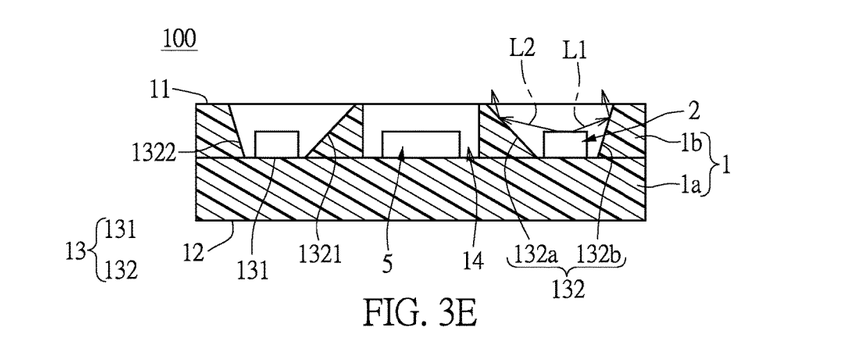
FIG. 3E is a schematic view showing a substrate formed by a circuit board and a frame.

As shown in FIG. 3E, the substrate 1 in the present embodiment may include a flat portion 1a and a partition 1b disposed on the flat portion 1a, and the flat portion 1a and the partition 1b are assembled to form the receiver 13. Specifically, the partition 1b has a plurality of thru-holes exposing a part of the flat portion 1a, and the light emitting units 2 and the photodetector 5 are arranged in the thru-holes of the partition 1b and are disposed on the flat portion 1a. The receiver 13 of the light guide structure can be defined by the flat portion 1a and corresponding one of the thru-holes of the partition 1b. The receiver 13 can contain the light emitting units 2, and can be used to guide light emitted by the light emitting units 2 to the predetermined reference axis C. That is to say that the bottom wall 131 of the receiver 13 is defined by a part of the top surface of the flat portion 1a, and the two side walls 132 formed with light reflecting function are obliquely within the corresponding one of the thru-holes of the partition 1b. Further, the two side walls 132 of the receiver 13 have an inner light reflecting portion 1321 proximal to the reference axis C (i.e., the inner side wall 132a of the receiver 13 as shown in FIG. 3E) and an outer light reflecting portion 1322 distal from the reference axis C (i.e., the outer side wall 132b of the receiver 13 as shown in FIG. 2A).

The slot 14 of the light guide structure can be defined by the flat portion 1a and another corresponding one of the thru-holes of the partition 1b, wherein the slot 14 can contain the photodetector 5 arranged in the reference axis C.

In addition, a plurality of spaces defined by the slot 14 and at least one of the surfaces of the side walls 132a, 132b of the receiver 13 can be optionally filled with the encapsulation 4. For example, one of spaces of the receivers 13 can be empty when the light emitting packages or chip scale packages (CSP) are adopted as the light emitting units 2.

In addition, the plurality of thru-holes can be formed as corresponding one by one or an annular-shape approximately symmetrical with respect to the reference axis C. The flat portion 1a can be a circuit board such as a ceramic board or a MCPCB.

Second Embodiment

Referring to FIG. 4 to FIG. 7, a second embodiment of the present disclosure is shown. The second embodiment is similar to the first embodiment, the main differences between the two embodiments being that: in this embodiment, a plurality of receivers 13 are formed in the substrate 1 and a plurality of annular inner wall surfaces 31 are formed in the frame body 3 and corresponding in position to the receivers 13 disposed in the substrate 1. That is, the light guide structure in this embodiment has a plurality of receivers 13 or further a plurality of annular inner wall surfaces 31 of the frame body 3 disposed on corresponding ones thereof.

Figure 4:
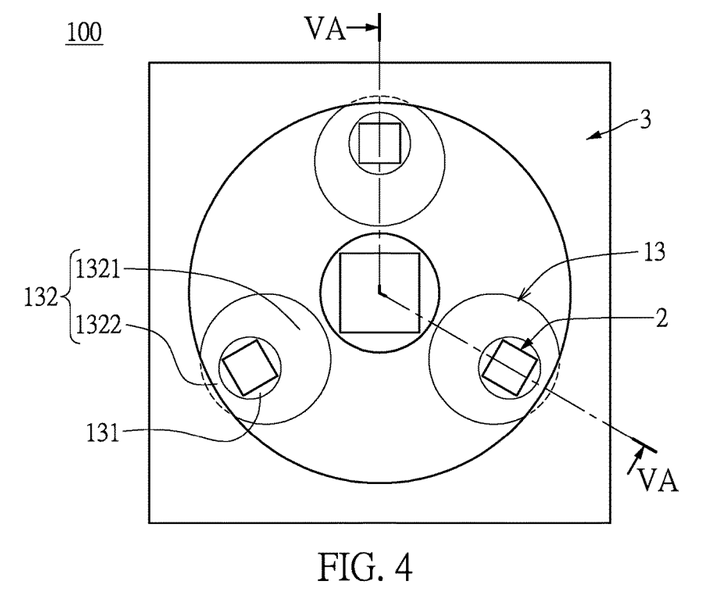
FIG. 4 is a schematic view of a second embodiment of an optical sensor according to the present disclosure.
Figure 5A:
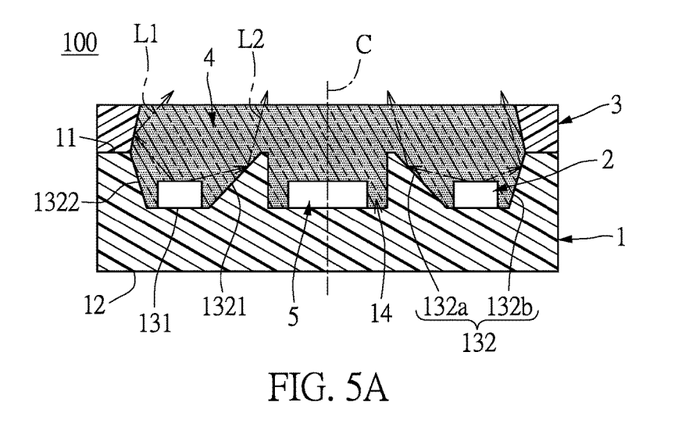
FIG. 5A is a cross-sectional view taken along line VA-VA of FIG. 4.
Figure 5B:
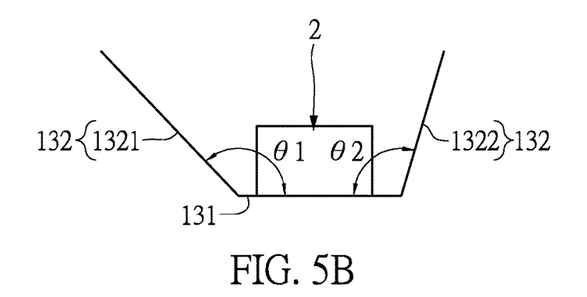
FIG. 5B is an enlarged schematic view of a part of FIG. 5A.
Figure 5C:
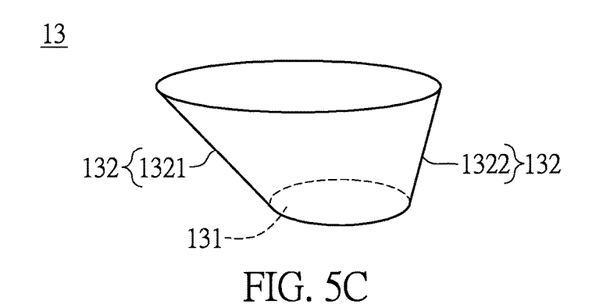
FIG. 5C is a perspective view of a receiver of the second embodiment of the optical sensor according to the present disclosure.

Specifically, as shown in FIG. 4 to FIG. 5C, the plurality of receivers 13 are recessed from the first substrate surface 11 of the substrate 1, where the receivers 13 are arranged approximately symmetrically with respect to the preset reference axis C, which overlaps with a central axis of the photodetector 5, and the light emitting units 2 are mounted on the bottom walls 131 of the receivers 13 respectively. Each of the receivers 13 has an approximately circular bottom wall 131 and a side wall 132 obliquely connected to the periphery of the bottom wall 131. Further, a corresponding opening formed at a top edge of the side wall 132 of the receiver 13 is also approximately circular. The side wall 132 has a light reflecting function that may, for example, be the result of being formed with a smooth surface or being plated with a light reflecting material, but is not limited thereto.

Further, an angle defined by the side wall 132 of each receiver 13 and the bottom wall 131 thereof gradually decreases in a direction away from the reference axis C. A part of the side wall 132 of each receiver 13 proximal to the reference axis C (i.e., an inner edge part of the side wall 132 of the receiver 13 as shown in FIG. 5A) is defined as an inner light reflecting portion 1321, and a part of the side wall 132 of the receiver 13 distal from the reference axis C (i.e., an outer edge part of the side wall 132 of the receiver 13 as shown in FIG. 5A) is defined as an outer light reflecting portion 1322.

Furthermore, as shown in FIG. 5B, for each receiver 13, an angle θ1 defined by the inner light reflecting portion 1321 and the bottom wall 131 of the receiver 13 is greater than an angle θ2 defined by the outer light reflecting portion 1322 and the bottom wall 131 of the receiver 13, and the angle θ2 defined by the outer light reflecting portion 1322 and the bottom wall 131 of the receiver 13 is not less than 90 degrees. The angle θ1 defined by the inner light reflecting portion 1321 and the bottom wall 131 of the receiver 13 is approximately 120 degrees to 165 degrees and the angle θ2 defined by the outer light reflecting portion 1322 and the bottom wall 131 of the receiver 13 is approximately 90 degrees to 150 degrees. Accordingly, the inner light reflecting portion 1321 and the outer light reflecting portion 1322 includes in each receiver 13 of the light guide structure enable the light L1, L2 emitted by the corresponding light emitting unit 2 to be reflected through their interfaces and then emitted towards the preset central axis C, thereby allowing the light emitted by the light emitting units 2 of the optical sensor 100 to be guided to an external object, which is similar to the first embodiment.

Figure 6A:
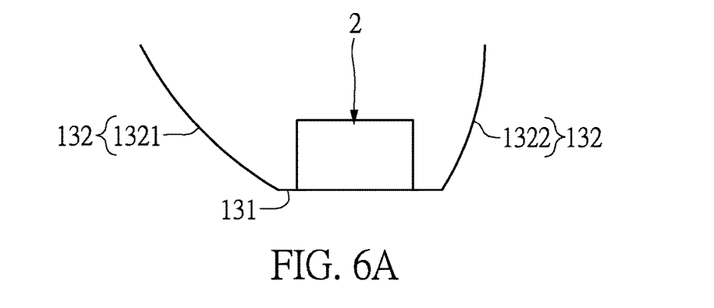
FIG. 6A is an enlarged schematic view of a part of FIG. 5A according to another implementation of the present disclosure.
Figure 6B:
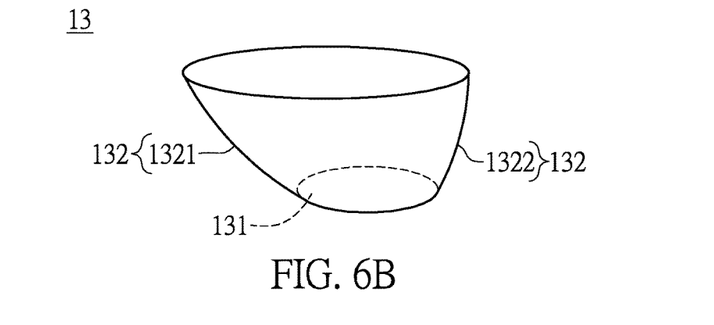
FIG. 6B is a perspective view of a receiver of FIG. 6A.

Moreover, the receivers 13 provided in this embodiment may also be adjusted according to designer requirements and are not limited to the implementation shown in FIG. 5B. For example, as shown in FIG. 6A and FIG. 6B, the side wall 132 of each receiver 13 may be an arc-shaped concave surface, that is, the receiver 13 may be a bowl-shaped construction.

The frame body 3, as with the other part of the light guide structure, has a plurality of near-circular through holes (not labeled); that is to say, the plurality of annular inner wall surfaces 31 of the frame body 3 respectively surround and define the circular through holes separated from each other, and the locations of the circular through holes are arranged approximately symmetrically with respect to the preset reference axis C. The frame body 3 is disposed on a part of the first substrate surface 11 outside the receivers 13. Moreover, the through holes of the frame body 3 respectively correspond in position to the receivers 13 and the slot 14 of the substrate 1. That is to say, the bottom edges of the inner wall surfaces 31 of the frame body 3 are substantially connected to the top edges of the side walls 132 of the receivers 13 respectively. An inner diameter of each of the inner wall surfaces 31 of the frame body 3 gradually decreases in a direction away from the first substrate surface 11 (from bottom to top in FIG. 5A). A minimum inner diameter of each of the inner wall surfaces 31 is not less than a maximum outer diameter of the bottom wall 131 of the corresponding receiver 13. Provided the above conditions are met, the inner wall surface 31 may be a planar surface or a curved surface (not shown), but is not limited thereto. Accordingly, the inner wall surfaces 31 of the frame body 3 of the light guide structure enable the light emitted by the light emitting units 2 to be reflected towards the reference axis C, thereby allowing the light emitted by the light emitting units 2 of the optical sensor 100 to be guided to the external object; that is, the light can be emitted towards the preset central axis C after being reflected by the interface of the frame body 3.

The optical sensor 100 has a plurality of encapsulation 4. Spaces surrounded by the receivers 13, the slot 14, and the corresponding inner wall surfaces 31 of the frame body 3 are respectively filled with the encapsulation 4; that is to say, a space surrounded by each of the receivers 13, the slot 14, and the corresponding inner wall surface 31 of the frame body 3 is filled with the encapsulation 4 so that the encapsulation 4 completely encapsulate the light emitting units 2.

From the above description, in the optical sensor 100 provided in the present embodiment, the light guide structure (for example, the inner light reflecting portion 1321, the outer light reflecting portion 1322, and the inner wall surface 31 of the frame body 3) is disposed to enable the light emitted by the light emitting units 2 to be emitted out towards the preset reference axis C after each being reflected by the surface of the light guide structure. Further, the light guide structure may include the frame body 3 with a plurality of through holes with predetermined profile. The plurality of through holes of the frame body 3 can also be connected to form a bulk hole with predetermined profile.

Figure 7:
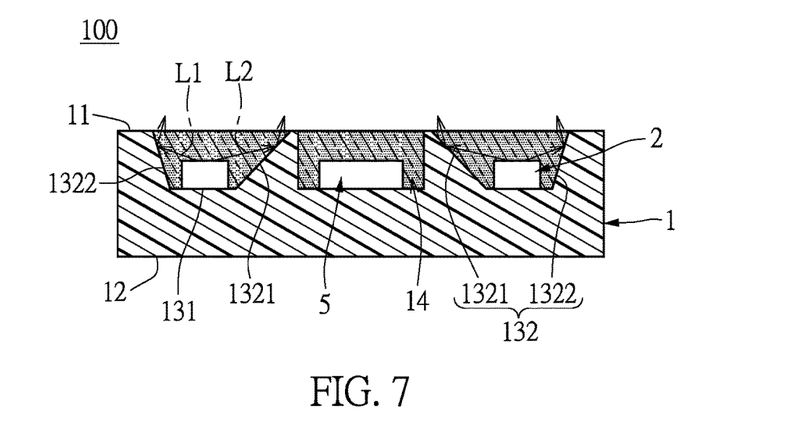
FIG. 7 is a cross-sectional view of the optical sensor shown in FIG. 5A in which a frame body is omitted.

Moreover, the optical sensor 100 provided in this embodiment may also be adjusted according to designer requirements and is not limited to the implementation shown in FIG. 5A. For example, as shown in FIG. 7, provided that the light reflecting effects of the inner light reflecting portion 1321 and the outer light reflecting portion 1322 of each of the receivers 13 are sufficient to meet the requirements, the frame body 3 may also be omitted from the optical sensor 100. Accordingly, the light guide structure of the optical sensor 100 can be formed as the plurality of the receivers 13 with predetermined profile which contain the plurality of light emitting units 2. Moreover, the substrate 1 also can be formed by a flat portion 1a and a partition 1b disposed on the flat portion 1a as shown as in FIG. 3E, wherein the flat portion 1a and the partition 1b are assembled to form the plurality of receivers 13 for containing corresponding one of the light emitting units 2 and a slot 14 for containing the photodetector 5 arranged in the reference axis C. In addition, a plurality of spaces defined by the slot 14 and the receiver 13 can be optionally filled with the encapsulation 4.

Third Embodiment

Figure 8:
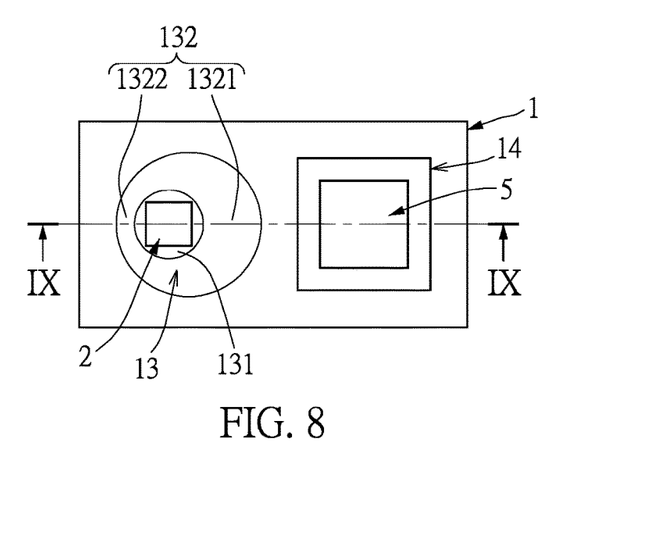
FIG. 8 is a schematic view of a third embodiment of an optical sensor according to the present disclosure.
Figure 9A:
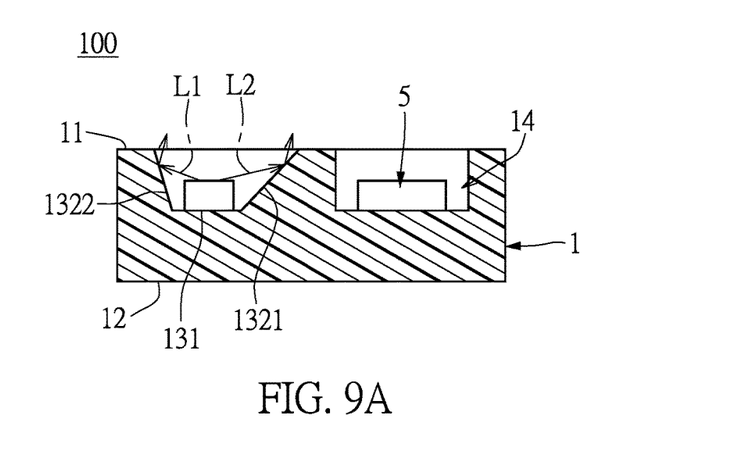
FIG. 9A is a cross-sectional view taken along line IX-IX of FIG. 8.
Figure 9B:
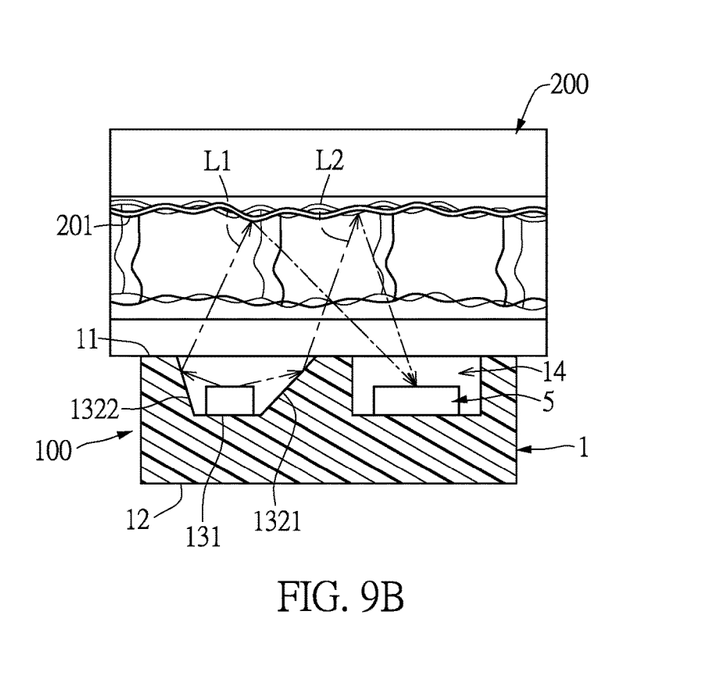
FIG. 9B is a schematic view showing the optical sensor of FIG. 9A applied to an external object.
Figure 10:
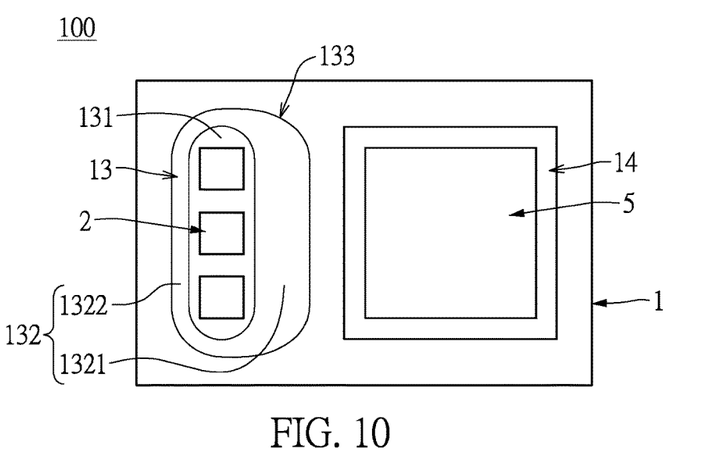
FIG. 10 is a schematic view showing another structure of the optical sensor according to the third embodiment of the present disclosure.

Referring to FIG. 8 to FIG. 10, a third embodiment of the present disclosure is shown. It should be first noted that relevant quantities and shapes shown in the figures corresponding to this embodiment are only provided to illustrate particular implementations of the present disclosure for ease of understanding, and not to limit the scope of the present disclosure.

Moreover, the third embodiment is similar to the second embodiment, the main difference between the two embodiments being the structure of the substrate 1.

As shown in FIG. 8 and FIG. 9A, the optical sensor 100 includes a substrate 1, a light emitting unit 2, and a photodetector 5. The substrate 1 in the present embodiment is formed with a receiver 13 and a slot 14 both recessed from the first substrate surface 11, and the receiver 13 is located at one side of the slot 14. The structure of the receiver 13 in the present embodiment is similar to that of the second embodiment, but the angle θ1 defined by the inner light reflecting portion 1321 and the bottom wall 131 of the receiver 13 can be further limited within a range of 120 degrees to 165 degrees.

Moreover, in the present embodiment, the inner side wall 132a of the receiver 13 proximal to the slot 14 is defined as the inner light reflecting portion 1321, and the outer side wall 132b of the receiver 13 distal from the slot 14 is defined as the outer light reflecting portion 1322.

The light emitting unit 2 and the photodetector 5 in the present embodiment are similar to that of the second embodiment. Specifically, the light emitting unit 2 is disposed in the receiver 13 of the substrate 1, and the inner light reflecting portion 1321 and the outer light reflecting portion 1322 enable light L1, L2 emitted by the light emitting unit 2 to be reflected towards an external object 200 (as shown in FIG. 9B). The photodetector 5 is disposed in the slot 14 of the substrate 1, and the photodetector 5 is configured for receiving the light emitted from the light emitting unit 2 and reflected by the external object.

In order to confirm the performance of the optical sensor 100, a simulation test was conducted for different types of the optical sensor 100 of the present embodiment (i.e., the angles θ1, θ2 of the receiver 13 is formed with different values), and the simulation results are disclosed in the following chart. In the simulation results, the different types of optical sensors 100, which are provided by the present embodiment, have good performance, and the optical sensors 100 of type 3 has an excellent performance.

| Type | θ1/θ2 (degrees/degrees) | | | |
| --- | --- | --- | --- | --- |
| | 90/90 Type 1 (counts) | 135/30 Type 2 (counts) | 135/90 Type 3 (counts) | 150/90 Type 4 (counts) |
| 20 mA | 11644 | 19908 | 35680 | 24904 |
| 40 mA | 12144 | 39972 | 95860 | 37312 |
| 60 mA | 27696 | 41468 | 176100 | 67824 |

The optical sensor 100 of the present embodiment can be provided with a different structure as shown in FIG. 10. Specifically, the receiver 13 has an ellipse-shaped top opening 133, the optical sensor 100 includes a plurality of light emitting units 2 disposed in the receiver 13, and the light emitting units 2 are arranged in a projecting space defined by orthogonally projecting the photodetector 5 toward the light emitting units 2. Moreover, the light emitting units 2 are arranged in a longitudinal direction of the ellipse-shaped top opening 133.

Specifically, as shown in FIG. 9B, the light L1, L2 emitted by the light emitting unit 2 of the optical sensor 100 can be guided to an external object 200 (e.g., blood vessels 201 in user's skin), and the photodetector 5 disposed in the slot 14 can receive the light reflected from the external object 200.

Fourth Embodiment

Figure 11:
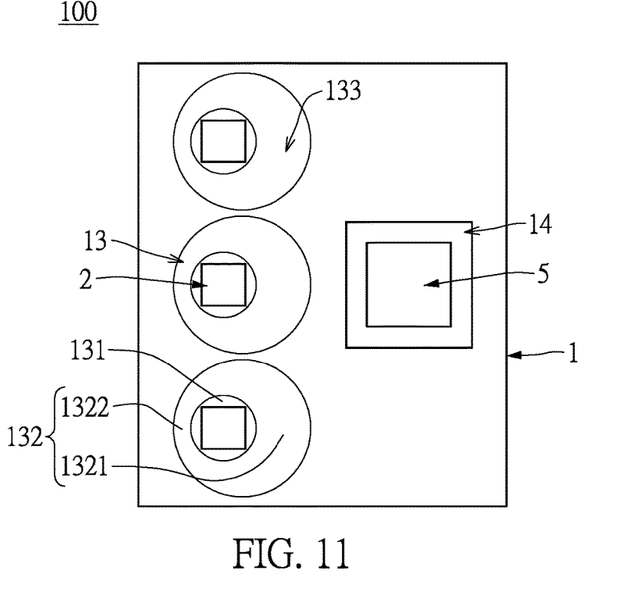
FIG. 11 is a schematic view of a fourth embodiment of an optical sensor according to the present disclosure.
Figure 12:
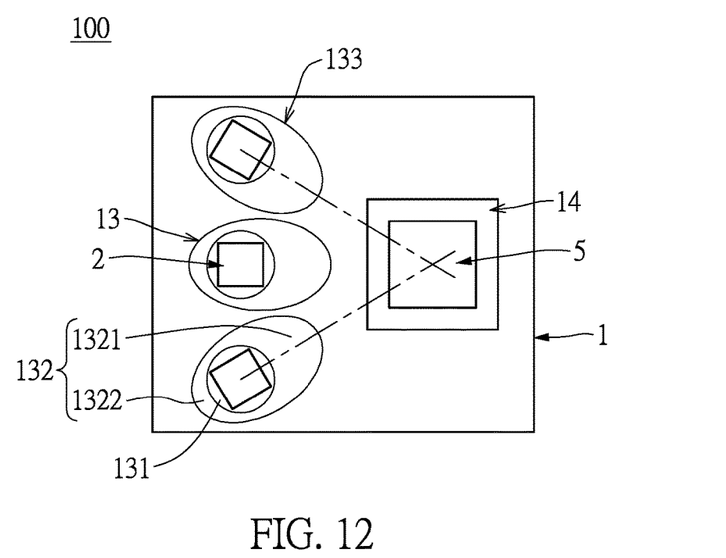
FIG. 12 is a schematic view showing another structure of the optical sensor according to the fourth embodiment of the present disclosure.

Referring to FIG. 11 and FIG. 12, a fourth embodiment of the present disclosure is shown. It should be first noted that relevant quantities and shapes shown in the figures corresponding to this embodiment are only provided to illustrate particular implementations of the present disclosure for ease of understanding, and not to limit the scope of the present disclosure.

Moreover, the fourth embodiment is similar to the third embodiment, the main difference between the two embodiments being the structure of the substrate 1.

As shown in FIG. 12, the optical sensor 100 includes a substrate 1, a plurality of light emitting units 2, and a photodetector 5. The substrate 1 in the present embodiment is formed with a plurality of receivers 13 and a slot 14, which are recessed from the first substrate surface 11. The receivers 13 are located at one side of the slot 14 and are preferably arranged in one row. The structure of each of the receivers 13 in the present embodiment is similar to that of the third embodiment. That is to say, the angle θ1 defined by the inner light reflecting portion 1321 and the bottom wall 131 of the receiver 13 can be further limited within a range of 120 degrees to 165 degrees.

The light emitting units 2 and the photodetector 5 in the present embodiment are similar to that of the third embodiment. Specifically, the light emitting units 2 are respectively disposed in the receivers 13 of the substrate 1, and the inner light reflecting portion 1321 and the outer light reflecting portion 1322 of each receiver 13 enable light emitted by the corresponding light emitting unit 2 to be reflected towards an external object. The photodetector 5 is disposed in the slot 14 of the substrate 1, and the photodetector 5 is configured for receiving the light emitted from each light emitting unit 2 and reflected by the external object.

In addition, the optical sensor 100 of the present embodiment can be provided with a different structure as shown in FIG. 13. Specifically, at least one of the receivers 13 has an ellipse-shaped top opening 133, and a longitudinal direction of the ellipse-shaped top opening 133 is orthogonal to a central axis of the photodetector 5, so that the receiver 13 having the ellipse-shaped top opening 133 can guide light from the corresponding light emitting unit 2 toward the central axis of the photodetector 5 for establishing a better cooperation between the corresponding light emitting unit 2 and the photodetector 5.

[Possible Effects of the Embodiments of the Present Disclosure]

In summary, in the optical sensors provided in the first, second, third and fourth embodiments of the present disclosure, the inner light reflecting portion and the outer light reflecting portion forming different angles with the bottom wall of the receiver enable light emitted by the light emitting units to be reflected towards the reference axis and thus project onto the external object (e.g., a skin), such that the external object can reflect the light toward the photodetector more accurately. The above description only provides preferred practical embodiments of the present disclosure, and is not intended to limit the scope of the present disclosure. All equivalent changes and modifications made according to the claims of the present disclosure should fall within the scope of the present disclosure.

What is claimed is:

1. An optical sensor, comprising:
   a substrate having a first substrate surface and a second substrate surface located at opposite sides, wherein the substrate has a preset reference axis perpendicular to the first substrate surface, at least one receiver is recessed from the first substrate surface of the substrate, and a slot is recessed from the first substrate surface of the substrate in the preset reference axis; wherein a side wall of the at least one receiver has an inner light reflecting portion proximal to the reference axis and an outer light reflecting portion distal from the reference axis, an angle defined by the inner light reflecting portion and a bottom wall of the at least one receiver is greater than an angle defined by the outer light reflecting portion and the bottom wall of the at least one receiver, and the angle defined by the outer light reflecting portion and the bottom wall of the receiver is not less than 90 degrees;
   a plurality of light emitting units, wherein the light emitting units include at least one first light emitting unit emitting a first light with a first spectrum and at least one second light emitting unit emitting a second light with a second spectrum different to the first spectrum, wherein the light emitting units are disposed in the at least one receiver of the substrate and the height of each of the light emitting units is less than the depth of the at least one receiver; wherein the inner light reflecting portion and the outer light reflecting portion enable light emitted by the light emitting units to be reflected towards the reference axis; and
   a photodetector disposed in the slot of the substrate, wherein the reference axis overlaps with a central axis of the photodetector, at least one of the light emitting units is configured for emitting light onto an external object, and the photodetector is configured for receiving the light reflected from the external object.

2. The optical sensor of claim 1, wherein the number of the at least one receiver is only one, and the receiver is of an annular shape substantially symmetrical with respect to the reference axis; an inner side wall of the receiver proximal to the reference axis is defined as the inner light reflecting portion; and an outer side wall of the receiver distal from the reference axis is defined as the outer light reflecting portion.

3. The optical sensor of claim 1, wherein the number of the at least one receiver is more than one, the receivers are respectively arranged symmetrically with respect to the reference axis, the light emitting units are mounted on bottom walls of the receivers; and an angle defined by the side wall of each of the receivers and the bottom wall thereof gradually decreases in a direction away from the reference axis.

4. The optical sensor of claim 2, further comprising a frame body, wherein the frame body has at least one annular inner wall surface, the frame body is disposed on a part of the first substrate surface outside the at least one receiver in the substrate, the inner wall surface of the frame body is substantially connected to the side wall of the at least one receiver in the substrate, an inner diameter of the inner wall surface of the frame body gradually decreases in a direction away from the first substrate surface, and the inner wall surfaces of the frame body respectively enable the light emitted by the light emitting units to be reflected towards the reference axis.

5. The optical sensor of claim 4, further comprising at least one encapsulation, wherein spaces surrounded by the at least one receiver in the substrate, the slot in the substrate, and the corresponding inner wall surface of the frame body are filled with the at least one encapsulation.

6. The optical sensor of claim 2, wherein in the at least one receiver in the substrate, the angle defined by the inner light reflecting portion and the bottom wall of the at least one receiver is approximately 120 degrees to 165 degrees, and the angle defined by the outer light reflecting portion and the bottom wall of the at least one receiver is approximately 90 degrees to 120 degrees.

7. The optical sensor of claim 3, further comprising a frame body, wherein the frame body has at least one annular inner wall surface, the frame body is disposed on a part of the first substrate surface outside the receivers in the substrate, the inner wall surface of the frame body is substantially connected to the side wall of each of the receivers in the substrate, an inner diameter of the inner wall surface of the frame body gradually decreases in a direction away from the first substrate surface, and the inner wall surfaces of the frame body respectively enable the light emitted by the light emitting units to be reflected towards the reference axis.

8. The optical sensor of claim 7, further comprising at least one encapsulation, wherein spaces surrounded by the receivers in the substrate, the slot in the substrate, and the corresponding inner wall surface of the frame body are filled with the at least one encapsulation.

9. The optical sensor of claim 3, wherein in each of the receivers in the substrate, the angle defined by the inner light reflecting portion and the bottom wall of the receiver is approximately 120 degrees to 165 degrees, and the angle defined by the outer light reflecting portion and the bottom wall of the receiver is approximately 90 degrees to 150 degrees.

10. The optical sensor of claim 1, wherein the light emitting units includes a red light emitting unit, a green light emitting unit, and an infrared light emitting unit, respectively.

11. The optical sensor of claim 1, wherein in the at least one receiver in the substrate, the angle defined by the inner light reflecting portion and the bottom wall of the at least one receiver is approximately 120 degrees to 165 degrees, and the angle defined by the outer light reflecting portion and the bottom wall of the at least one receiver is approximately 90 degrees to 120 degrees.

12. An optical sensor, comprising:
a substrate having a first substrate surface and a second substrate surface located at opposite sides, wherein the substrate has a preset reference axis perpendicular to the first substrate surface, at least one receiver is recessed from the first substrate surface of the substrate, and a slot is recessed from the first substrate surface of the substrate in the preset reference axis; wherein a side wall of the at least one receiver has an inner light reflecting portion proximal to the reference axis and an outer light reflecting portion distal from the reference axis, an angle defined by the inner light reflecting portion and a bottom wall of the at least one receiver is greater than an angle defined by the outer light reflecting portion and the bottom wall of the at least one receiver, and the angle defined by the outer light reflecting portion and the bottom wall of the at least one receiver is not less than 90 degrees;
a plurality of light emitting units disposed in the at least one receiver of the substrate, wherein the reference axis overlaps with a central axis of the photodetector, and the inner light reflecting portion and the outer light reflecting portion enable light emitted by the light emitting units to be reflected towards the reference axis; and
a photodetector disposed in the slot of the substrate.

13. An optical sensor, comprising:
a substrate having a first substrate surface and a second substrate surface located at opposite sides, wherein the substrate has at least one receiver and a slot recessed from the first substrate surface of the substrate; wherein a side wall of the at least one receiver has an inner light reflecting portion proximal to the slot and an outer light reflecting portion distal from the slot, an angle defined by the inner light reflecting portion and a bottom wall of the at least one receiver is greater than an angle defined by the outer light reflecting portion and the bottom wall of the at least one receiver, and the angle defined by the outer light reflecting portion and the bottom wall of the at least one receiver is not less than 90 degrees;
at least one light emitting unit disposed in the at least one receiver of the substrate, wherein the inner light reflecting portion and the outer light reflecting portion enable light emitted by the light emitting unit to be reflected towards an external object; and
a photodetector disposed in the slot of the substrate, wherein the photodetector is configured for receiving the light reflected from the external object.

14. The optical sensor of claim 13, wherein in the at least one receiver in the substrate, the angle defined by the inner light reflecting portion and the bottom wall of the at least one receiver is approximately 120 degrees to 165 degrees, and the angle defined by the outer light reflecting portion and the bottom wall of the at least one receiver is approximately 90 degrees to 120 degrees.

15. The optical sensor of claim 13, wherein the receiver is located at one side of the slot; an inner side wall of the receiver proximal to the slot is defined as the inner light reflecting portion; and an outer side wall of the receiver distal from the slot is defined as the outer light reflecting portion.

16. The optical sensor of claim 15, wherein the number of the at least one light emitting unit is more than one, the light emitting units are disposed in the receiver, and the light emitting units are arranged in a projecting space defined by orthogonally projecting the photodetector toward the light emitting units.

17. The optical sensor of claim 16, wherein the receiver has an ellipse-shaped top opening, and the light emitting units are arranged in a longitudinal direction of the ellipse-shaped top opening.

18. The optical sensor of claim 13, wherein the number of the at least one receiver is more than one, the number of the at least one light emitting unit is more than one, and the light emitting units are respectively disposed in the receivers, wherein the receivers are located at one side of the slot; an inner side wall of each of the receivers proximal to the slot is defined as the inner light reflecting portion; and an outer side wall of each of the receivers distal from the slot is defined as the outer light reflecting portion.

19. The optical sensor of claim 18, wherein at least one of the receivers has an ellipse-shaped top opening, and a longitudinal direction of the ellipse-shaped top opening is orthogonal to a central axis of the photodetector.

20. The optical sensor of claim 13, wherein in the at least one receiver in the substrate, the angle defined by the inner light reflecting portion and the bottom wall of the at least one receiver is approximately 120 degrees to 150 degrees, and the angle defined by the outer light reflecting portion and the bottom wall of the at least one receiver is approximately 90 degrees to 120 degrees.

\* \* \* \* \*